United States Patent [19]

Rawal

[11] 4,414,844
[45] Nov. 15, 1983

[54] RAPID INSULATION RESISTANCE TEST FOR BISMUTH-CONTAINING CERAMIC CAPACITORS

[75] Inventor: Bharat Rawal, Myrtle Beach, S.C.
[73] Assignee: AVX Corporation, Myrtle Beach, S.C.
[21] Appl. No.: 286,684
[22] Filed: Jul. 24, 1981
[51] Int. Cl.$^3$ ............................................. G01N 33/38
[52] U.S. Cl. .................................... 73/104; 73/432 R
[58] Field of Search ................. 73/432 R, 432 Z, 104; 250/307; 29/574

[56] References Cited

U.S. PATENT DOCUMENTS 4,081,857 3/1978 Hanold .............................. 29/25.42

OTHER PUBLICATIONS

*Soviet Powder Metallurgy and Metal Ceramics*, vol. 16, No. 7, Jul. 1977, A. N. Pilyankevich, p. 552–555.
"An Electron Microscopical Investigation of Hard Alloys based on Chromium Cabide" *Soviet Powder Metallurgy and Metal Ceramics*, vol. 20, No. 6, A. N. Pilyankevich pp. 419–423.
"Compartive Investigation of Brittle Fracture Microstructures by Scanning and Replica Tranmission Electron Microscopy", Jun. 1981.
*Soviet Powder Metallurgy and Metal Ceramics*, vol. 17, No. 1, p. 80–81, N. E. Kharitinych, "Determination of the Depth of Impregnation of Porous Iron–Graphite Materials with a Capron–Finely Divided Copper Metallic Polymer", Jan. 1978.

*Primary Examiner*—S. Clement Swisher
*Assistant Examiner*—Brian Tumm
*Attorney, Agent, or Firm*—Arthur B. Colvin

[57] ABSTRACT

The present invention relates to a method for rapidly determining the insulation resistance characteristics of bismuth-containing ceramic capacitors, and more particularly to ceramic capacitors incorporating a barium titanate dielectric. The test is predicated upon the discovery that capacitors of the type described and having satisfactory insulation characteristics exhibit a high percentage of inter-granular fracture. Capacitors of identical composition and apparently identical physical characteristics which, when fractured, evince a high percentage of trans-granular fractures have been found to exhibit unacceptably low insulation resistance characteristics.

3 Claims, 6 Drawing Figures

RAPID INSULATION RESISTANCE TEST FOR BISMUTH-CONTAINING CERAMIC CAPACITORS

BACKGROUND OF THE INVENTION

1. Field of the Invention

The present invention is in the field of ceramic capacitors, and more particularly pertains to a test for rapidly determining whether a ceramic capacitor of a given batch of the type more particularly hereinafter set forth will evince satisfactory IR (Insulation resistance) characteristics.

2. The Prior Art

There is shown and described in U.S. Pat. No. 4,081,857, by way of example, a series of processing steps and formulations for the fabrication of ceramics to be utilized as the dielectric element of ceramic capacitors. The patent is representative of typical formulations and methods of fabrication of a fired ceramic which employ Barium titanate as a principal ingredient in conjunction with a bismuth compound: Bismuth-containing ceramic dielectric materials, in addition to Barium titanate include stannates, zirconates, niobates, titanates, oxides and solid solutions, and unfired mixtures of the foregoing are known to have certain highly desirable characteristics including, without limitation, a high capacitance per unit size. In particular this patent pertains to formulations which are also referred to as grain growth inhibited barium bismuth titanate ceramics used for BX,X7R or NPO applications.

A desirable and, in most instances, a necessary characteristic of capacitors of the type described, is a high IR characteristic, particularly at high temperatures. More specifically, it is considered highly desirable for all such capacitors to evince an initial IR characteristic of 300 or greater measured in megohms/microfarad ($M\Omega.\mu f$) using the rated voltage at 125° C.

Initial IR characteristics of from 100 to 300 $M\Omega.\mu f$ are considered to be partially acceptable, whereas capacitors having an initial IR characteristic of lower than 100 $M\Omega/\mu f$ are considered to be useful only in limited applications.

Typical IR testing is done on a per batch basis—that is to say, a batch of capacitors is fabricated and representative samples thereof are selected for testing. It is generally recognized that the entirety of a given batch will evince the same IR characteristics as the selected samples.

The factors which can affect the IR characteristic are only partially understood and minute changes in purity of materials, times and temperatures of processing, etc. are apparently critical to the IR characteristic. Notwithstanding great care taken in the selection of starting materials, compounding of formulae and processing, it is apparently impossible consistently to assure the fabrication of capacitors of the type described having IR characteristics within an acceptable or desirable range.

Current IR testing techniques are time-consuming and add greatly to the expense of producing ceramic capacitors. Typically, the completion of a testing program of a given batch will require a time lapse of some six weeks.

In accordance with current techniques, the selected samples of a given batch are terminated in conventional manner and the terminations fitted with leads. The termination and lead attachment procedures normally take approximately two days in the laboratory. The samples are then measured for initial IR at 25° C. using the rated voltage. The IR measurement is carried out at the temperature of interest by applying the rated voltage to the capacitor in series with a current limiting resistor. The current is read by using an electrometer (for example, but not limited to, Model 26200 electrometer from Keithley Instruments Inc., Cleveland, Ohio) and the IR is calculated using the Ohm's law.

Assuming that the initial IR characteristics at 25° C. are satisfactory the units are placed in a chamber at 125° C. and the initial IR at this temperature is determined according to the procedure described above. The samples are then placed in a chamber and subjected to twice the rated voltage at 125° C. for various time intervals till 1,000 hours are completed. The samples are removed at each of these pre-determined time intervals during the above voltage treatment and the IR at 125° C. is evaluated to study the degradation, if any, of IR due to this treatment.

It is apparent from the above procedure, also known as life test, that the further processing of the entire batch of fired chip capacitors must be set aside for a protracted period as a result of current six week long IR test techniques.

SUMMARY OF THE INVENTION

The present invention may be summarized as directed to an improved IR testing technique which permits the IR of a batch of capacitors to be rapidly and accurately predicted and evaluated.

More particularly, I have discovered a direct correlation between the IR characteristics of a ceramic capacitor of the type described, eg. utilizing barium titanate as the principal ingredient with various metal oxides as donors, acceptors, modifiers and sintering aids and having Bismuth ions present, and its fracture characteristics. More specifically, the test procedure involves fracturing a capacitor to be tested and examining the fracture surface under extreme magnification, e.g. in the range of approximately 5,000 magnifications. I have discovered that there is a direct correlation between the IR characteristic and the percentage of inter-granular pattern in the exposed fracture. More specifically, where the exposed surface exhibits a 90% or better inter-granular (as opposed to trans-granular) fracture characteristic an IR in excess of 300 $M\Omega.\mu f$ at 125° C. will be exhibited by capacitors formed from the subject batch.

Where the intergranular fracture percentage is approximately 20% or less, the IR characteristic at 125° C. is unacceptably low, i.e. is below 1 $M\Omega/\mu f$. When the intergranular percentages from 20 to 75% are observed, the $M\Omega/\mu f$ of 1 to 100 will be evinced by the batch and for intergranular percentages from 75 to 90% the $M\Omega/\mu f$ values are between 100 and 300 $M\Omega.\mu f$.

Test results derived from measuring in the manner described correlated substantially 100% with the results of conventional testing procedures and permit the determination of the IR characteristics of the batch in a manner of hours or less as compared with the currently required multi-week test period.

Accordingly, it is an object of the present invention to provide a rapid IR test technique for bismuth containing ceramic capacitors and particularly, but without limitation of those capacitors employing barium titanate as a principal component of the dielectric element.

A further object of the invention is the provision of a testing technique which accurately and rapidly permits the IR characteristic of a batch of ceramic capacitors of the type described to be determined.

To attain these objects and such further objects as may appear herein or be hereinafter pointed out, reference is made to the accompanying drawings in which.

Figure 1A:
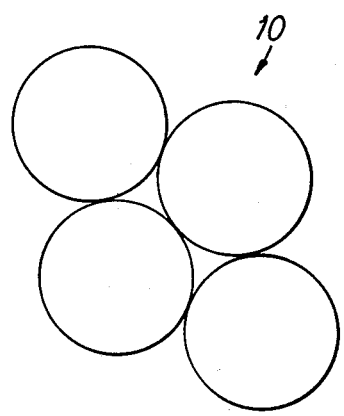
FIG. 1A is a diagrammatic magnified view of a portion of a ceramic capacitor prior to fracture.
Figure 2A:
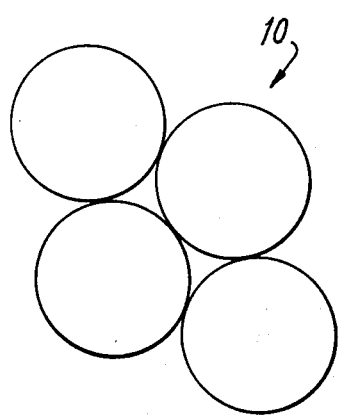
FIG. 2A is a diagrammatic magnified view of a portion of a ceramic capacitor prior to fracture.

Referring now to the drawings and particularly to FIGS. 1A and 2A thereof, there are diagrammatically disclosed increments of a fired ceramic manufactured in accordance with U.S. Pat. No. 4,081,857. It will be appreciated that while the above referenced patent is noted by way of example of a barium titanate dielectric material into which increments of bismuth ions have been diffused, the test procedure has been found to function with any of a wide variety of dielectric Titanate or oxide systems containing bismuth ions used for BX and X7R ceramics. Additionally, the test procedure has been found to function essentially independently of the grain size of the ceramic composition.

In order to perform the test, a capacitor to be tested is placed on a flat metallic surface. A sharp chisel is placed against the surface of the chip with the cutting edge parallel to the support surface of the chip. The chip tested is generally in the configuration of a flat wafer, square or rectangular in plan. The chisel is struck a blow in the direction of the support surface and the resultant halves of the wafer are collected and examined. Preferably, the portions of the wafer examined are those which have not actually come into contact with the chisel, but which are fractured as a result of the impact of the chisel against other portions of the chip. Numerous alternative means for effecting the fracture may be employed.

The selected chip surface is subjected to examination by a scanning electron microscope (SEM). Without limitation, a suitable S.E.M. is Model Cambridge, S4, manufactured by Cambridge Scientific Instruments, Ltd., Cambridge, England. The surface exposed by the cracking procedure is the one examined. Magnification in the order of about 5000 times has been found optimum for most applications.

Figure 1B:
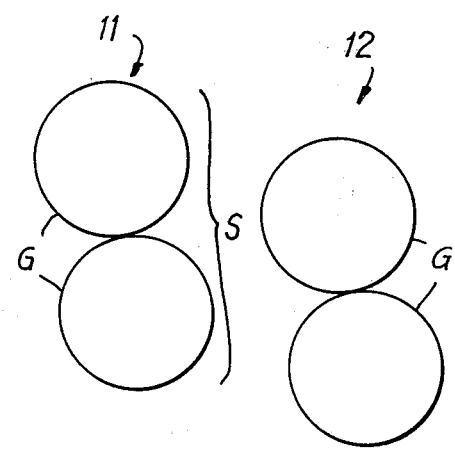
FIG. 1B is a view similar to FIG. 1A illustrating an inter-granular fracture pattern.
Figure 2B:
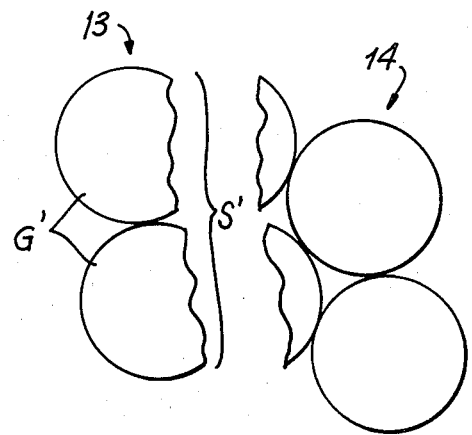
FIG. 2B is a view similar to FIG. 1B illustrating a trans-granular fracture pattern.

Referring now to FIGS. 1A and 2A, fragments 10 of the ceramic chip are disclosed prior to fracture. In FIGS. 1B and 2B the chips are shown to have been fractured into segments 11,12, (FIG. 1B) and segments 13,14 (FIG. 2B). The surfaces S (FIG. 1B) and S' (FIG. 2B) are the surfaces scanned.

Figure 3:
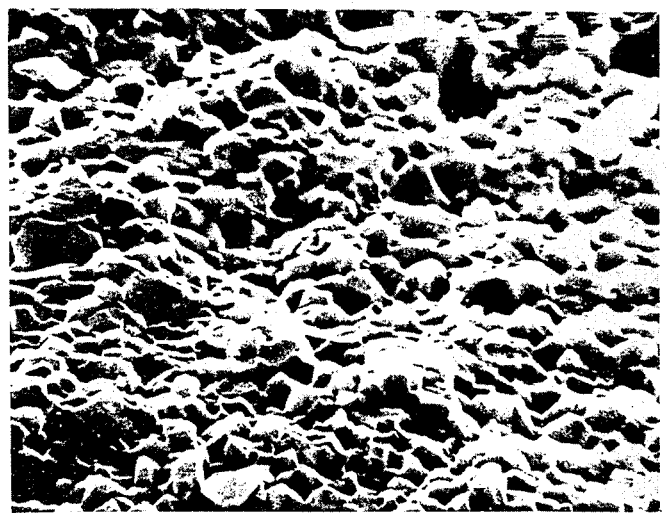
FIG. 3 is a reproduction of an actual section of fractured ceramic shown at a magnification of 5000× and illustrating a preponderately inter-granular fracture pattern.
Figure 4:
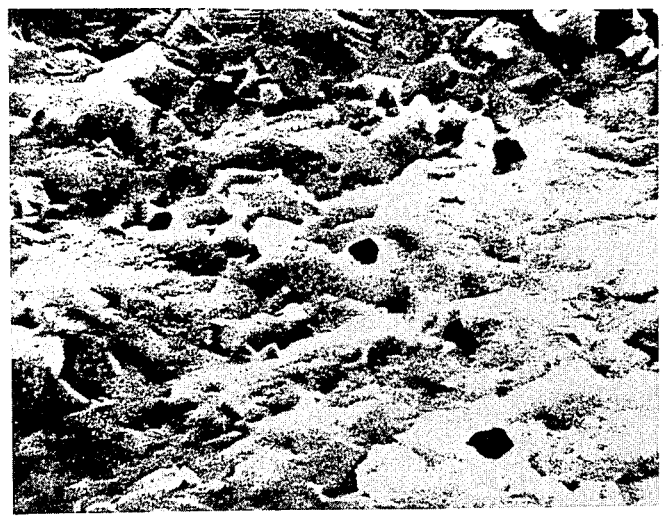
FIG. 4 is a reproduction of an actual section of fractured ceramic shown at a magnification of 5000× and illustrating a preponderately trans-granular fracture pattern.

Surface S evinces an idealized inter-granular fracture pattern, i.e. the individual grains G of which the ceramic is composed have severed along the surface lines coincident with the surface of the grains. As will be appreciated from an examination of the appearance of the actual portion, FIG. 3 of a preponderantly inter-granular fracture, i.e. in the order of about 95% inter-granular and 5% transgranular, the exposed portions of the surface are for the most part rounded. In contrast, the surface S' as appearing in FIG. 2B evinces a breakage of the actual grains G', whereby the examined surface will disclose in large proportion elements of the interior of the grains (Transgranular fracture) rather than the grain surface components. In comparison with the surface configuration of FIG. 3, for example, FIG. 4 discloses a high incidence, e.g. about 90% of flat, sharply angular cleavage lines intersecting the grains. The noted phenomenon is essentially independent of grain size, as is illustrated by a comparison of the grain pattern of FIG. 4, which illustrates a coarser tested ceramic.

In order to make a determination as to the IR characteristics, preferably a plurality of samples of each batch are fractured and inspected in the manner noted and evaluated from the standpoint of the percentage of rounded inter-granular fraction areas of a given portion scanned by the microscope. As noted hereinabove, where such percentage equals approximately 90% or more, the dielectric material will exhibit an extremely high IR characteristic, i.e. in the neighborhood of greater than 300 M$\Omega$/$\mu$f. Where the percentage of rounded components falls in the area of about 20% or less, the M$\Omega$/$\mu$f will be less than 1.0. Intermediate values of inter-granular fracture are indicative of intermediate IR values.

Without intending to be bound thereby, I have evolved the theory that the fracture characteristic and, hence, also the IR characteristic, is a function of the penetration of the bismuth ions into the structure of the grains. Where the bismuth concentrations are heaviest at or near the periphery of the grains, the ceramic tends to fracture inter-granularly and to exhibit a high IR factor. Conversely, where the bismuth ions have diffused essentially homogeneously into the interior of the grains, the ceramic tends to fracture trans-granularly, and exhibit low IR characteristics.

Assuming the accuracy of the correlation between bismuth concentration and the nature of the fracture patterns of the ceramic, the test may provide a means for aiding in the establishment of fabricating techniques wherein low diffusion of bismuth into the grains is achieved.

It will be recognized by those skilled in the art familiarized with the instant disclosure that there is provided in accordance with the present invention a procedure for rapidly and accurately determining the IR characteristic of bismuth-containing ceramic capacitors. The correlation between IR characteristic measured conventionally with that measured in accordance with the method of the present invention has been found to be essentially 100%.

The method has been found to be essentially independent of grain size and of the composition of the ceramic provided, as noted, that bismuth ions are present.

Having thus described the invention and illustrated its use, what is claimed as new and is desired to be secured by Letters Patent is:

1. The method of determining the insulation resistance characteristics of a ceramic capacitor containing bismuth ions which comprises the steps of causing the fracture of a fired sample of said capacitor to expose an internal area thereof, and establishing an insulation resistance factor as a function of the proportion of inter-granular fracture present in said exposed area.

2. The method in accordance with claim 1 wherein said fracture is formed essentially perpendicular to the plane of a layer of ceramic of said capacitor.

3. The method of determining the insulation resistance characteristic of a batch of ceramic capacitors containing bismuth ions which comprises the steps of selecting at least one capacitor from said batch, causing the selected said capacitor to be fractured to expose an internal area thereof, determining the proportion of trans-granular to inter-granular fractures present in said exposed area, and establishing an insulation resistance factor of said batch in accordance with the proportion of trans-granular fracture to inter-granular fracture observed in said exposed area.

* * * * *